(12) United States Patent
Cole et al.

(10) Patent No.: US 10,607,690 B2
(45) Date of Patent: Mar. 31, 2020

(54) DRAM SENSE AMPLIFIER ACTIVE MATCHING FILL FEATURES FOR GAP EQUIVALENCE SYSTEMS AND METHODS

(71) Applicant: MICRON TECHNOLOGY, INC., Boise, ID (US)

(72) Inventors: Steve V. Cole, Boise, ID (US); Benjamin A. Millemon, Meridian, ID (US); Toby D. Robbs, Boise, ID (US); J. W. Thompson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/557,688

(22) Filed: Aug. 30, 2019

(65) Prior Publication Data
US 2020/0075083 A1   Mar. 5, 2020

Related U.S. Application Data

(63) Continuation of application No. 16/118,798, filed on Aug. 31, 2018, now Pat. No. 10,418,093.

(51) Int. Cl.
*G11C 7/00* (2006.01)
*G11C 11/4091* (2006.01)
*G11C 7/08* (2006.01)
*G11C 11/4094* (2006.01)
*G11C 11/408* (2006.01)

(52) U.S. Cl.
CPC ............ *G11C 11/4091* (2013.01); *G11C 7/08* (2013.01); *G11C 11/4085* (2013.01); *G11C 11/4087* (2013.01); *G11C 11/4094* (2013.01)

(58) Field of Classification Search
CPC . G11C 11/161; G11C 11/1673; G11C 11/419; G11C 11/1675; G11C 11/412; G11C 11/1657; G11C 11/1655; G11C 11/4096; G11C 7/06; G11C 11/1659; G11C 11/418
See application file for complete search history.

(56) References Cited

U.S. PATENT DOCUMENTS 10,418,093 B1 * 9/2019 Cole .................... G11C 11/4091
2005/0046438 A1 * 3/2005 Tam .................... G01R 19/0023
324/76.11

* cited by examiner

*Primary Examiner* — Thong Q Le
(74) *Attorney, Agent, or Firm* — Fletcher Yoder, P.C.

(57) ABSTRACT

A memory device may include a memory array with multiple memory cells and one or more sense amplifiers connected to the memory array. Each sense amplifier may include a matched pair of transistors. An active matching fill feature may also be included proximate to at least one transistor of the matched pair of transistors.

20 Claims, 9 Drawing Sheets

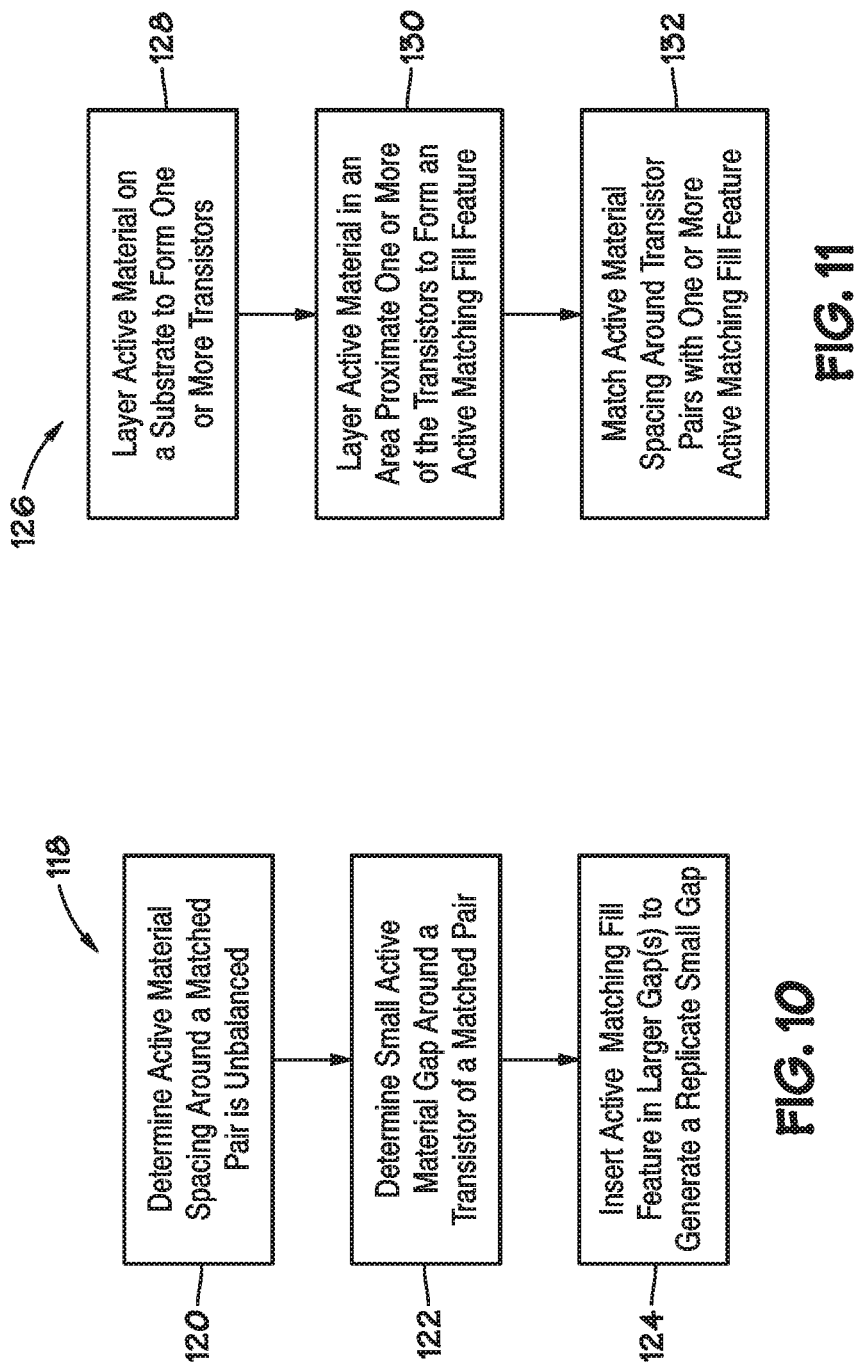

US 10,607,690 B2

DRAM SENSE AMPLIFIER ACTIVE MATCHING FILL FEATURES FOR GAP EQUIVALENCE SYSTEMS AND METHODS

This application is a continuation of U.S. patent application Ser. No. 16/118,798, which is entitled "DRAM SENSE AMPLIFIER ACTIVE MATCHING FILL FEATURES FOR GAP EQUIVALENCE SYSTEMS AND METHODS," filed Aug. 31, 2018, and projected to issue as U.S. Pat. No. 10,418,093 on Sep. 17, 2019, which is incorporated by reference herein in its entirety for all purposes.

BACKGROUND

Embodiments described herein relate generally to the field of memory devices. More specifically, the current embodiments include one or more systems, devices, and methods that include active area support features to maintain balanced sense amplifier operations.

DESCRIPTION OF RELATED ART

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Various modes of operation in memory devices may lead to the accessing of memory cells on the memory device. During such operations, sense amplifiers may sense the voltage of a memory cell and output a logical 1 or 0 corresponding to the sensed voltage. Furthermore, each sense amplifier may include a matched pair of transistors that operate in parallel. As such, it may be desirable to have each matched pair operate with approximately identical tolerances and operating conditions. However, due to the layout of the memory device, one or more matched pairs may experience systematic variations between their respective transistors. Accordingly, embodiments described herein may be directed to one or more of the problems set forth above.

BRIEF DESCRIPTION OF DRAWINGS

FIG. 5 is a schematic diagram illustrating the layout of a portion of an example memory device, in accordance with an embodiment of the present disclosure;

FIG. 10 is a flowchart of an example method for generating a layout of a memory device, in accordance with an embodiment of the present disclosure; and FIG. 11 is a flowchart of an example method for introducing an active matching fill feature to a memory device, in accordance with an embodiment of the present disclosure.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

It may be desirable at multiple times to access the memory cells on a memory device. During such operations, sense amplifiers may sense the voltage of a memory cell and output a logical 1 or 0 corresponding to the sensed voltage. Furthermore, each sense amplifier may include a matched pair of transistors that operate in parallel. As such, it may be desirable to have each matched pair operate with approximately identical tolerances and operating conditions. However, due to the layout of the memory device, one or more matched pairs may experience systematic variations (e.g., in current draw) between their respective transistors. For example, mechanical stress from surrounding physical features (e.g., material layers, shallow trench isolation, etc.) may cause a change in current in one or both transistors of a matched pair transistors. Such a variation may, in turn, cause the paired transistors to have different voltage thresholds when reading a memory cell relative to each other. As is described in detail below, it may be desirable to eliminate systematic variation amongst a matched pair of transistors of a sense amplifier in a memory device.

Figure 1:
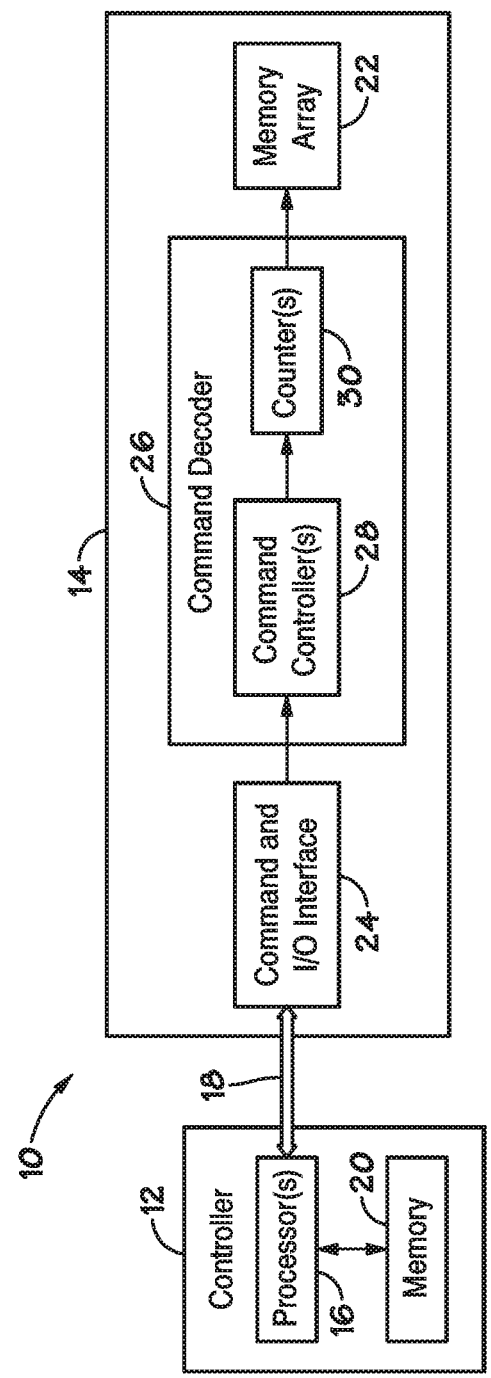
FIG. 1 is a block diagram illustrating a computer system, in accordance with an embodiment of the present disclosure.

Referring now to FIG. 1, a simplified block diagram of a computer system 10, which may provide for sequential access of a memory device, is illustrated. The computer system 10 includes a controller 12 and a memory device 14. The controller 12 may include processing circuitry, such as one or more processors 16 (e.g., one or more microprocessors), that may execute software programs to provide various signals to the memory device 14 over one or more bi-directional communication buses 18 to facilitate the transmission and receipt of data to be written to or read from the memory device 14. Moreover, the processor(s) 16 may include multiple microprocessors, one or more "generalpurpose" microprocessors, one or more special-purpose microprocessors, and/or one or more application specific integrated circuits (ASICS), or some combination thereof. For example, the processor(s) 16 may include one or more reduced instruction set (RISC) processors.

The processor(s) 16 may be coupled to one or more memories 20 that may store information such as control logic and/or software, look up tables, configuration data, etc. In some embodiments, the processor(s) 16 and/or the memory 20 may be external to the controller 12. The memory 20 may include a tangible, non-transitory, machine-readable-medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). The memory 20 may store a variety of information and may be used for various purposes. For example, the memory 20 may store machine-readable and/or processor-executable instructions (e.g., firmware or software) for the processor(s) 16 to execute, such as instructions for providing various signals and commands to the memory device 14 to facilitate the transmission and receipt of data to be written to or read from the memory device 14.

The memory device 14 includes a memory array 22 of individual memory cells. As described further below, the memory array 22 may include one or more memory banks that may be grouped or partitioned in a variety of ways to provide access to the cells of the memory array 22, as described below. The controller 12 may communicate with the memory device 14 through one or more command and input/output (I/O) interfaces 24. In general, the command and input/output interfaces 24 provide access to various components of the memory device 14 by external devices, such as the controller 12.

The memory device 14 may include a command decoder 26. The command decoder 26 may receive command signals from the command and input/output (I/O) interfaces 24 and may decode the command signals to provide various internal commands. For instance, the command decoder 26 may decode commands, such as read commands, write commands, mode-register set commands, activate commands, etc., and provide access to specified regions of the memory array 22. Further, in order to generate internal addresses to be accessed, one or more counters 30 may also be provided. It should be noted that while the command controller 28 and counters 30 are illustrated as being part of the command decoder 26, alternatively, these elements may be provided elsewhere on the memory device 14.

Figure 2:
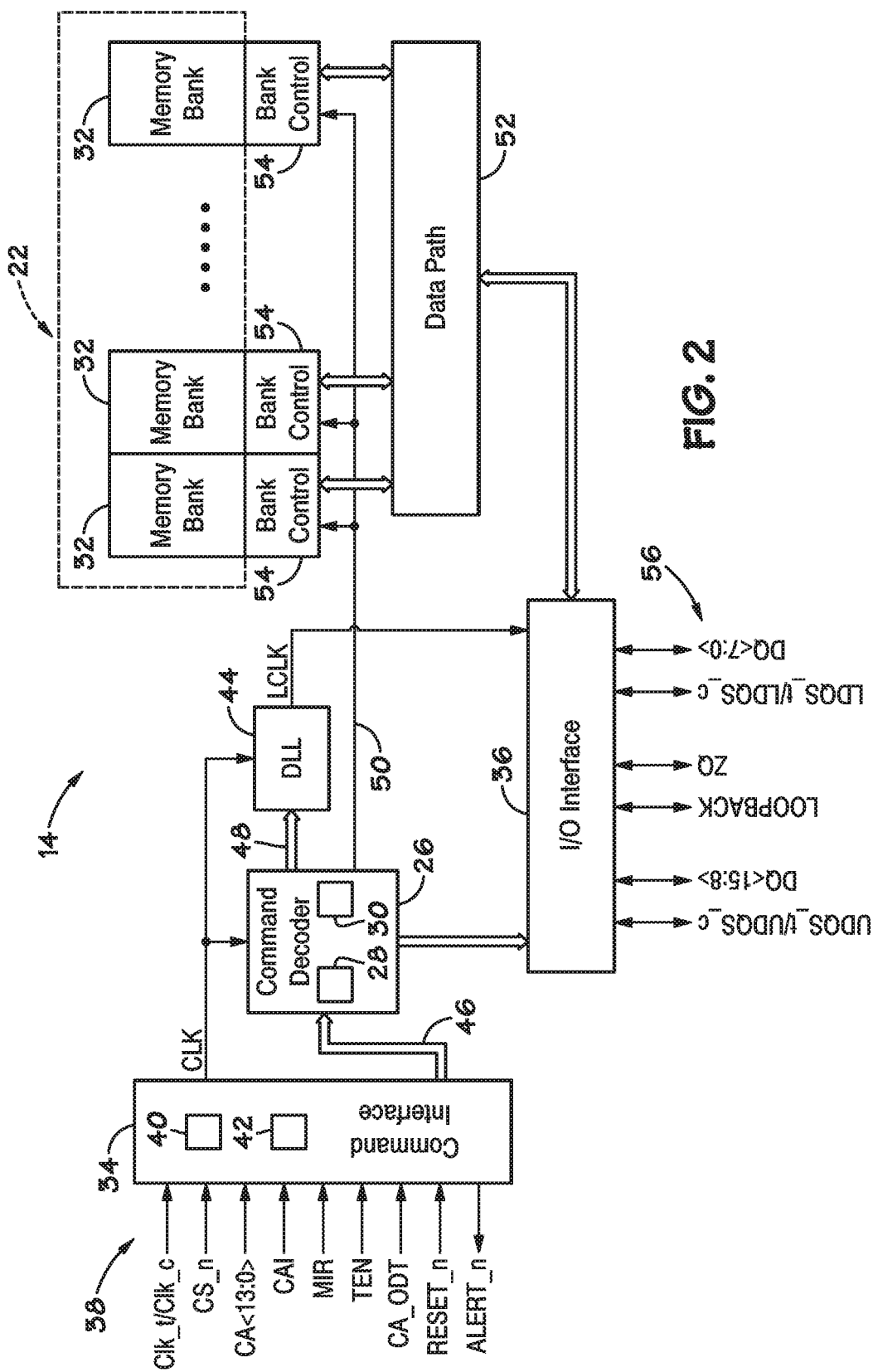
FIG. 2 is a block diagram illustrating an example memory device, in accordance with an embodiment of the present disclosure.

The block diagram of FIG. 2 is a functional block diagram illustrating certain additional features and related functionality of the memory device 14. In accordance with one embodiment, the memory device 14 may be a double data rate type five synchronous dynamic random access memory (DDR5 SDRAM) device. Various features of DDR5 SDRAM allow for reduced power consumption, more bandwidth, and more storage capacity compared to prior generations of DDR SDRAM. However, as will be appreciated, the embodiments discussed herein may be utilized with any suitable type of memory device 14.

The memory device 14, may include a memory array 22 logically and functionally grouped into a number of memory banks 32. The memory banks 32 may be DDR5 SDRAM memory banks, for instance. The memory banks 32 may be provided on one or more chips (e.g., SDRAM chips) that are arranged on dual inline memory modules (DIMMS). Each DIMM may include a number of SDRAM memory chips (e.g., x8 or x16 memory chips). Each SDRAM memory chip may include one or more memory banks 32. The memory device 14 represents a portion of a single memory chip (e.g., SDRAM chip) having a number of memory banks 32. For DDR5, the memory banks 32 may be further arranged to form bank groups. For instance, for an 8 gigabit (Gb) DDR5 SDRAM, the memory chip may include 16 memory banks 32, arranged into 8 bank groups, each bank group including 2 memory banks. For a 16 Gb DDR5 SDRAM, the memory chip may include 32 memory banks 32, arranged into 8 bank groups, each bank group including 4 memory banks, for instance. Various other configurations, organization and sizes of the memory banks 32 on the memory device 14 may be utilized depending on the application and design of the overall system.

The memory device 14 may also include a command interface 34 and an input/output (I/O) interface 36. The command interface 34 may provide a number of signals (e.g., signals 38) from an external device, such as a processor 16 or controller 12. The processor 16 or controller 12 may provide various signals 38 over one or more bi-directional data buses (e.g., data bus 18) to and from the memory device 14 to facilitate the transmission and receipt of data to be written to or read from the memory device 14.

As will be appreciated, the command interface 34 may include a number of circuits, such as a clock input circuit 40 and a command address input circuit 42, for instance, to ensure proper handling of the signals 38. The command interface 34 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 40 receives the true clock signal (Clk_t) and the complementary clock signal (Clk_c) and generates an internal clock signal CLK. The internal clock signal CLK is supplied to an internal clock generator 44, such as a delay locked loop (DLL) circuit. The internal clock generator 44 generates a phase controlled internal clock signal LCLK based on the received internal clock signal CLK. The phase controlled internal clock signal LCLK is supplied to the I/O interface 36, for instance, and is used as a timing signal for determining an output timing of read data.

The internal clock signal CLK may also be provided to various other components within the memory device 14 and may be used to generate various additional internal clock signals. For instance, the internal clock signal CLK may be provided to a command decoder 26. The command decoder 26 may receive command signals from the command bus 50 and may decode the command signals to provide various internal commands. For instance, the command decoder 26 may provide command signals to the internal clock generator 44 over the bus 48 to coordinate generation of the phase controlled internal clock signal LCLK. The phase controlled internal clock signal LCLK may be used to clock data through the I/O interface 36, for instance.

Further, the command decoder 26 may decode commands, such as read commands, write commands, activate commands, and mode-register set commands and provide access to a particular memory bank 32 corresponding to the command, via the bus path 52. As will be appreciated, the memory device 14 may include various other decoders, such as row decoders and column decoders, to facilitate access to the memory banks 32. In one embodiment, each memory bank 32 includes a bank control block 54 which provides the necessary decoding (e.g., row decoder and column decoder), as well as other features, such as timing control and data control, to facilitate the execution of commands to and from the memory banks 32.

The memory device 14 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 34 using the clock signals (Clk_t and Clk_c). The command interface 34 may include a command address input circuit 42 which is configured to receive and transmit the commands to provide access to the memory banks 32, through the command decoder 26, for instance. In addition, the command interface 34 may receive a chip select signal (CS_n). The CS_n signal enables the memory device 14 to process commands on the incoming CA<13:0> bus. Access to specific banks 32 within the memory device 14 is encoded on the CA<13:0> bus with the commands.

In addition, the command interface 34 may be configured to receive a number of other command signals. For instance, a command/address on die termination (CA_ODT) signal may be provided to facilitate proper impedance matching within the memory device 14. A reset command (RESET_n) may be used to reset the command interface 34, status registers, state machines and the like, during power-up for instance. The command interface 34 may also receive a command/address invert (CAI) signal which may be provided to invert the state of command/address signals CA<13:0> on the command/address bus, for instance, depending on the command/address routing for the particular memory device 14. A mirror (MIR) signal may also be provided to facilitate a mirror function. The MIR signal may be used to multiplex signals so that they can be swapped for enabling certain routing of signals to the memory device 14, based on the configuration of multiple memory devices in a particular application. Various signals to facilitate testing of the memory device 14, such as the test enable (TEN) signal, may be provided, as well. For instance, the TEN signal may be used to place the memory device 14 into a test mode for connectivity testing.

The command interface 34 may also be used to provide an alert signal (ALERT_n) to the system processor or controller for certain errors that may be detected. For instance, an alert signal (ALERT_n) may be transmitted from the memory device 14 if a cyclic redundancy check (CRC) error is detected. Other alert signals may also be generated. Further, the bus and pin for transmitting the alert signal (ALERT_n) from the memory device 14 may be used as an input pin during certain operations, such as the connectivity test mode executed using the TEN signal, as described above.

Data may be sent to and from the memory device 14, utilizing the command and clocking signals discussed above, by transmitting and receiving data signals 56 through the I/O interface 36. More specifically, the data may be sent to or retrieved from the memory banks 32 over the data path 52, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 14, certain memory devices, such as DDR memory devices may utilize data strobe signals, generally referred to as DQS signals. The DQS signals are driven by the external processor or controller sending the data (e.g., for a write command) or by the memory device 14 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 14, for instance.

An impedance (ZQ) calibration signal may also be provided to the memory device 14 through the I/O interface 36. The ZQ calibration signal may be provided to a reference pin and used to tune output drivers and ODT values by adjusting pull-up and pull-down resistors of the memory device 14 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 14 and GND/VSS external to the memory device 14. This resistor acts as a reference for adjusting internal ODT and drive strength of the IO pins.

In addition, a loopback signal (LOOPBACK) may be provided to the memory device 14 through the I/O interface 36. The loopback signal may be used during a test or debugging phase to set the memory device 14 into a mode wherein signals are looped back through the memory device 14 through the same pin. For instance, the loopback signal may be used to set the memory device 14 to test the data output (DQ) of the memory device 14. Loopback may include both a data and a strobe or possibly just a data pin. This is generally intended to be used to monitor the data captured by the memory device 14 at the I/O interface 36.

As will be appreciated, various other components such as power supply circuits (for receiving external VDD and VSS signals), mode registers (to define various modes of programmable operations and configurations), read/write amplifiers (e.g., sense amplifiers to amplify signals during read/write operations), temperature sensors (for sensing temperatures of the memory device 14), etc., may also be incorporated into the memory system 10. Accordingly, it should be understood that the block diagram of FIG. 2 is only provided to highlight certain functional features of the memory device 14 to aid in the subsequent detailed description, and is a non-limiting example of a memory device 14 utilizing the present embodiments.

Figure 3:
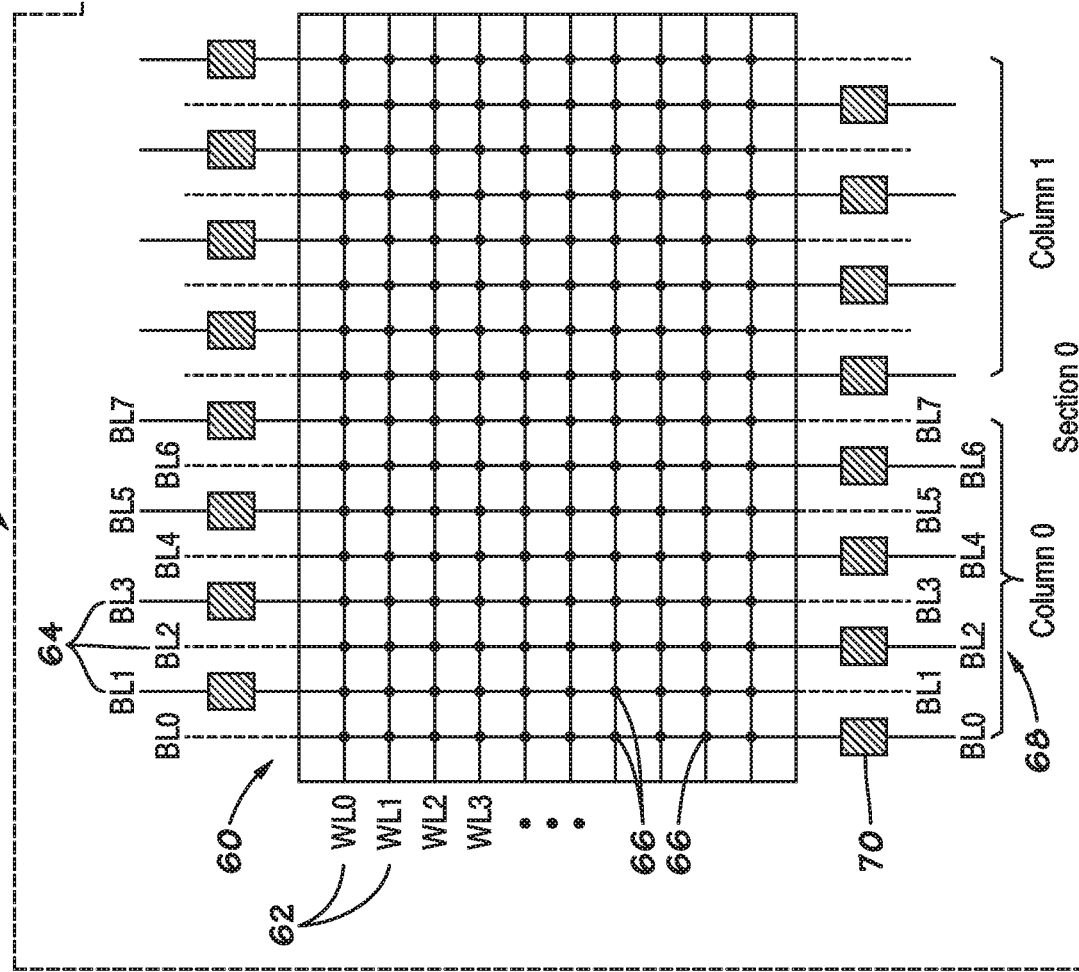
FIG. 3 is a schematic diagram of a portion of the memory device of FIG. 2, in accordance with an embodiment of the present disclosure.

In some embodiments, the memory banks 32 may be divided into one or more sections 60, as shown in FIG. 3. Each section 60 may include a grid of multiple wordlines 62, also known as rows, and bitlines 64, also known as digit lines. The intersection of a wordline 62 and a bitline 64 may then yield an individual memory cell 66 to store a single bit of data. Although logical data (e.g., 1s and 0s) are stored in each memory cell 66 defined by wordlines 62 and bitlines 64, to access the memory cells, each wordline 62 and bitline 64 may be assigned an address. Addresses within a section 60 may include a row address and a columns address. While a row address may include only one row/wordline 62, a column address may include multiple columns 68, which, in turn, may also include multiple bitlines 64. For example, a column 68 may include eight bitlines 64, and a single column address may access sixteen columns 68. As such, 128 memory cells 66 (1×(8×16)) may be identified by the same row and column address. This may be referred to as 16n pre-fetch because sixteen columns 68 may be called upon by single column address. In some embodiments each column 68 may have more or fewer bitlines 64. For example, in one embodiment, each column includes one bitline 64. In such a case, columns 68 and bitlines 64 may be one and the same. Furthermore, in some embodiments, a single column address may access just one column. Therefore, each row and column address may be associated with a single memory cell 66. Although depicted in FIG. 3 with only ten wordlines 62 and two columns 68, as will be appreciated, a section 60 may have any number of rows 62 and columns 68 depending on the application and design of the overall system.

On each bitline 64, a sense amplifier 70 may be used to determine the logical state of a memory cell 66. For example, when a bitline 64 is activated, along with a corresponding wordline 62, the logical state of a memory cell 66 may be read by the sense amplifier 70. The sense amplifier 70 may then compare the read value to a reference value, amplify the difference between the two, and output the determined value of the memory cell 66. As such, the sense amplifier 70 may draw power from a power supply to amplify and hold the read value. Additionally, as illustrated, the sense amplifiers 70 for each bitline 64 may be located physically on alternating sides of the section 60. However, in other embodiments, the sense amplifiers 70 may be located on the same side of the section 60 or elsewhere depending on the application and design of the memory device 14.

Figure 4:
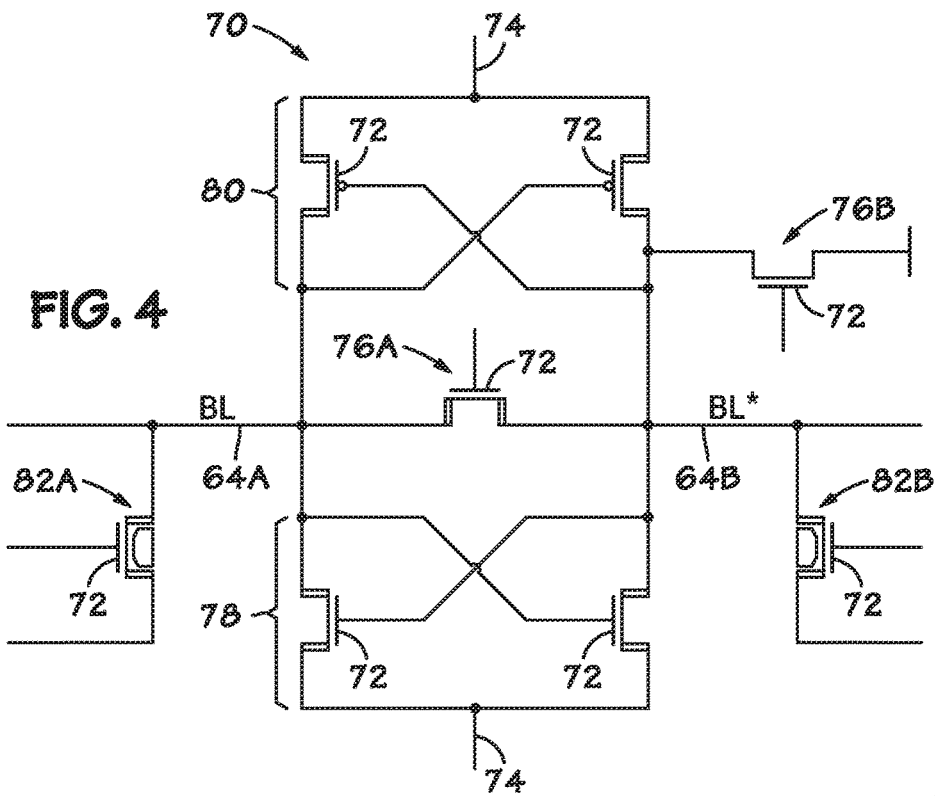
FIG. 4 is a schematic diagram of an example sense amplifier, in accordance with an embodiment of the present disclosure.

To help further illustrate, FIG. 4 is a schematic diagram of an example sense amplifier 70. A sense amplifier may include multiple (e.g., 2, 3, 4, etc.) transistors to direct current flow and assist in determining the logical value of a memory cell 66. For example, reference voltages representing ground (e.g., representing a logical 0), supply voltage (e.g., representing a logical 1), or an intermediate voltage (e.g., ½ the supply voltage) may be maintained on reference inputs 74. Such reference inputs 74 may drive the circuit to a logical 1 or 0 depending on the input from a bitline 64. In some embodiments, bitlines 64 may include a bitline 64A (e.g., representative of the voltage from the memory cell 66) and a complement bitline 64B (e.g., an inverse bitline representative of the supply voltage minus the voltage from the memory cell 66). When sensed by the sense amp 70, the bitlines 64A, 64B may be driven by respective reference inputs 74 to their respective logical values (e.g., 1 or 0) corresponding to the voltage from the memory cell 66. For example, if the memory cell voltage was initially equivalent to a logical 1, the bitline 64A would be driven to a logical 1, and the complement bitline 64B would be driven to a logical 0. In some embodiments, the sense amplifier 70 may also include one or more equalization transistors 76A, 76B forming an equalization circuit 76 to increase the efficiency and/or accuracy of the sense amp 70. Additionally, some sense amplifiers 70 may also include input/output transistors 82A, 82B forming an input/output circuit 82 to assist in the communication with the memory cells 66. As will be appreciated, multiple different types of sense amps 70 (e.g., voltage threshold (VTH), voltage transfer characteristic (VTC), or other suitable sense amplifiers 70) may be used in a memory device 14, and the example of FIG. 4 is non-limiting.

Sense amplifiers 70 may be constructed, for example, by layering materials of different electrical properties onto a substrate (e.g., a wafer). Different electrical properties, such as charge carrying capability, may be generated by doping a semiconductor (e.g., silicon, germanium, etc.) with impurities to create an active material. For example, an n-type semiconductor active material may include a dopant (e.g., phosphorus, arsenic, antimony, etc.) that uses electrons as a primary charge carrier. Additionally, a p-type semiconductor active material may include a dopant (e.g., boron, aluminum, gallium, etc.) that uses holes as a primary charge carrier.

The transistors 72 of a sense amplifier 70 may use either n-type semiconductors and/or p-type semiconductors. In some embodiments, a sense amplifier 70 may be considered to have an n-type transistor section 78 and a p-type transistor section 80. The gates of such transistors 72 may also include a gate material (e.g., polysilicon, copper, precious metals, etc.) to activate, deactivate, and/or regulate, current flow through the transistor 72. Additional materials and/or other electrical components (e.g., diodes, resistors, capacitors, etc.) may also be present within the memory device 14 depending on implementation. Furthermore, in some embodiments, shallow trench isolation (STI) may be employed to assist in separating transistors 72 and/or other electrical components of a memory device 14 on a substrate. As will be appreciated, the transistors 72 in the n-type transistor section 78 and the transistors 72 in the p-type transistor section 80 of a sense amplifier 70 may be matched such that the operational characteristics (e.g., voltage characteristics) of each pair are approximately equal. However, due to the layout of the sense amplifiers 70, active material, and STI, some transistors 72 may incur different electromagnetic field stresses, which may cause temperature and/or voltage variations, which may, in turn, cause a variation to the operational characteristics between a matched pair of transistors 72.

Figure 6:
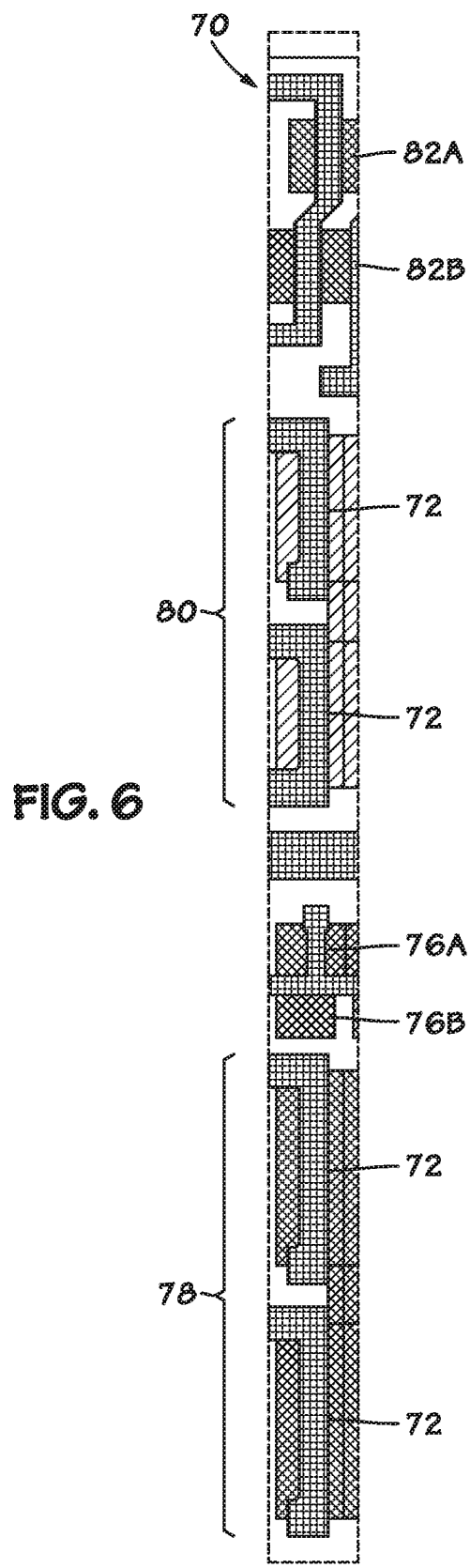
FIG. 6 is a magnified view of a portion of FIG. 5 depicting a sense amplifier, in accordance with an embodiment of the present disclosure.

To help illustrate, FIG. 5 is an example layout 84 of multiple sense amplifiers 70 and communication lines. The layout 84 of multiple sense amplifiers 70 may include n-type transistor sections 78, p-type transistor sections 80, equalization circuits 76, input/output circuits 82, and/or a read/write section 86. The input/output circuits 82 and read/write section 86 may facilitate communications and/or control within the memory device 14. For example, the read/write section may include transistors 72 for activating wordlines 62 and/or bitlines 64. Furthermore, the read/write section 86 and/or the input/output circuits 82 may facilitate communication of the sensed logic level from a memory cell 66 to through the data path 52 and/or I/O interface 36. In some embodiments, the bitline 64A and/or the complement bitline 64B (not shown) may elongate in the up and down direction along a sense amplifier 70. Additionally, an n-type pair 88 of transistors 72 along with a p-type pair 90 of transistors 72 may together form a sense amplifier 70. In the depicted example, the transistors pairs 88, 90 are aligned with each other. However, other layouts, such as a staggered transistor layout, wherein the transistors 72 of one row are offset from the transistors 72 of an adjacent row, may also be used depending on implementation. In further illustration of one embodiment, FIG. 6 is a magnified view of a single sense amplifier 70 from FIG. 5 illustrating the transistors 72 of FIG. 4. As mentioned above, each section of active material, together with a layering of gate material, may yield a corresponding transistor 72.

Figure 7:
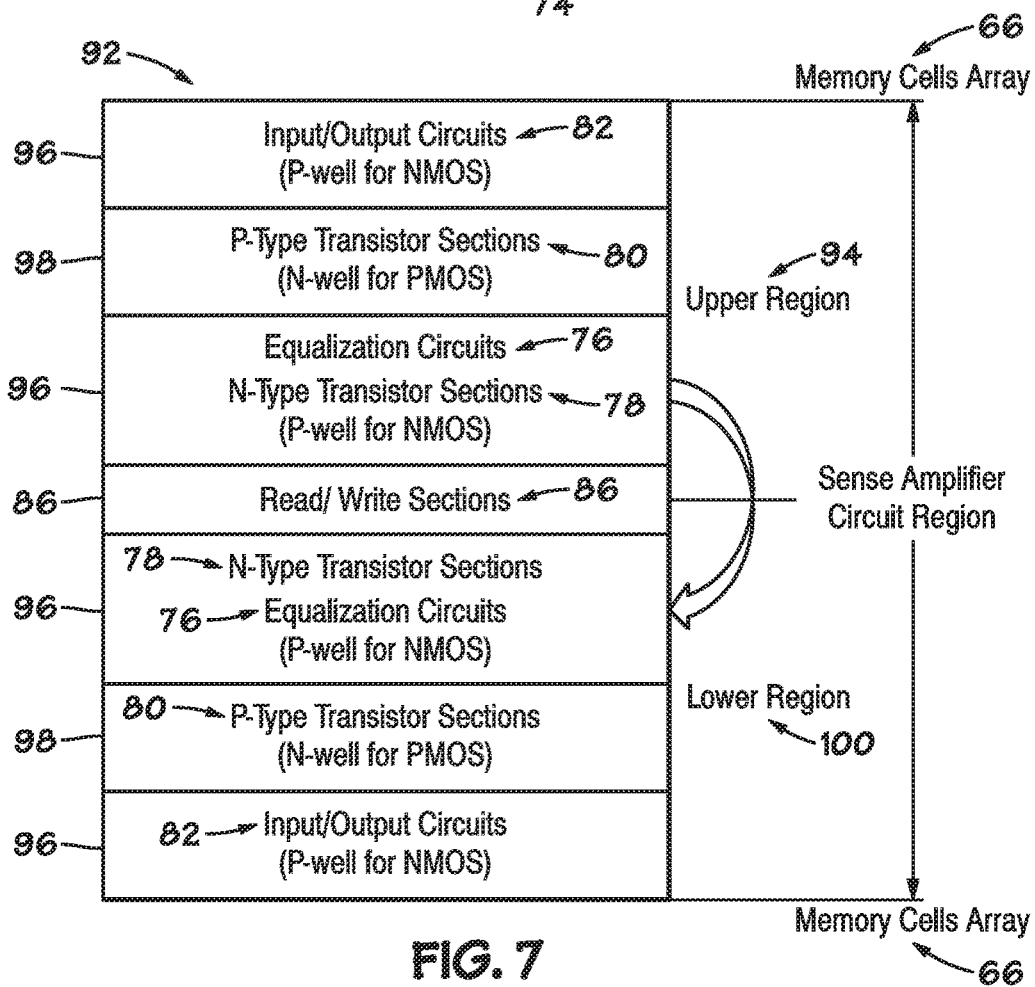
FIG. 7 is a schematic layout of regions of a memory device; in accordance with an embodiment of the present disclosure.

In some embodiments the layout (e.g., layout 84) of sense amplifiers may be mirrored across the read/write section 86, or other suitable section, as shown in the schematic layout 92 of FIG. 7. For example, an upper region 94 may include general p-well sections 96 and n-well sections 98 for creating transistors. For example, a p-well section 96 may be used to create n-type transistors 72 (e.g., n-type metal-oxide-semiconductor field-effect transistors (MOSFETs), and an n-well section 98 may be used to create p-type transistors 72 (e.g., p-type MOSFETs). As stated above, in some embodiments, the upper region 94 may be mirrored about the read/write section 86 in the form of a lower region 100. The lower region 100 may be substantially similar to the upper region 94, but with a mirrored geometry.

Returning to FIG. 5, in the example layout 84, the active materials of many of the transistors 72 are separated from each other and/or the active material of other components (e.g., active materials associated with the input/output circuits 82, equalization circuits 76, and/or the read/write section 86) via, for example, STI. For example, the transistors 72 of the n-type transistor sections 78 may have an upper n-type gap 102 between the active material of an upper n-type transistor 72 and the active material of an equalization circuit 76, lower n-type gap 104A between the active material of a lower n-type transistor 72 and the active material of the read/write section 86, and lower n-type gap 104B spanning the read/write section 86, for example, to a mirrored n-type transistor section 78. Additionally, the transistors 72 of the p-type transistor sections 80 may also have separating features such as an upper p-type gap 106 and a lower p-type gap 108. Such gaps 102, 104A, 104B, 106, 108 may be of any suitable size (e.g., 10 nano-meters (nm), 50 nm, 100 nm, 1 micrometer (µm), etc.) depending on implementation. As used herein, the terms upper and lower may refer to a relative placement as depicted in the example layout 84, and is, as such, non-limiting.

As described above, it may be desirable to match the operational characteristics of the transistors 72 of each pair 88, 90. However, the positioning of active materials and STI may lead to mechanical stress (e.g., compressive or tensile) that, in turn, may cause variations in the operational characteristics between a pair 88, 90 of transistors 72. For example, unequal spacing between active materials may cause one transistor 72 of a pair 88, 90 to operate with a different mobility or threshold/activation voltage. Such uneven conductions may cause an imbalance between the transistors 72 of a pair 88, 90 in their response to the same gate voltage. In some embodiments, the variation between activation voltages of the transistors 72 of a pair 88, 90 may be desired to be less than approximately 1 millivolt (mV), 5 mV, 10 mV, 25 mV, or 100 mV. However, due at least in part to unequal active material spacing, the variation may be greater than desired.

As such, it may be desirable to match the spacing between active materials on matched pairs of transistors 72. For example, the layout 84 may be organized such that the upper p-type gap 106 and the lower p-type gap 108 may be approximately equal (e.g., less than a 1 nm, 5 nm, 20 nm, or 50 nm difference) for each p-type pair 90. Likewise, it may be desirable for the upper n-type gap 102 to be approximately equal to the lower n-type gap 104A. However, in some layouts (e.g., layout 84), the upper n-type gap 102 may be different from the lower n-type gap 104B due to component placement, for example, in the read/write section 86. An n-type pair 88 with different upper and lower gaps (e.g., upper n-type gap 102 and lower n-type gap 104B) may have systematic differences in the operational characteristics of its respective transistors 72. A difference in operational characteristics may likewise occur in a p-type pair 90 if, for example, the p-type pair 90 had different upper and lower gaps. As such it may be desirable to arrange or rearrange the current electrical components of a memory device 14 to provide an approximately equal active material spacing between pairs 88, 90.

Figure 8:
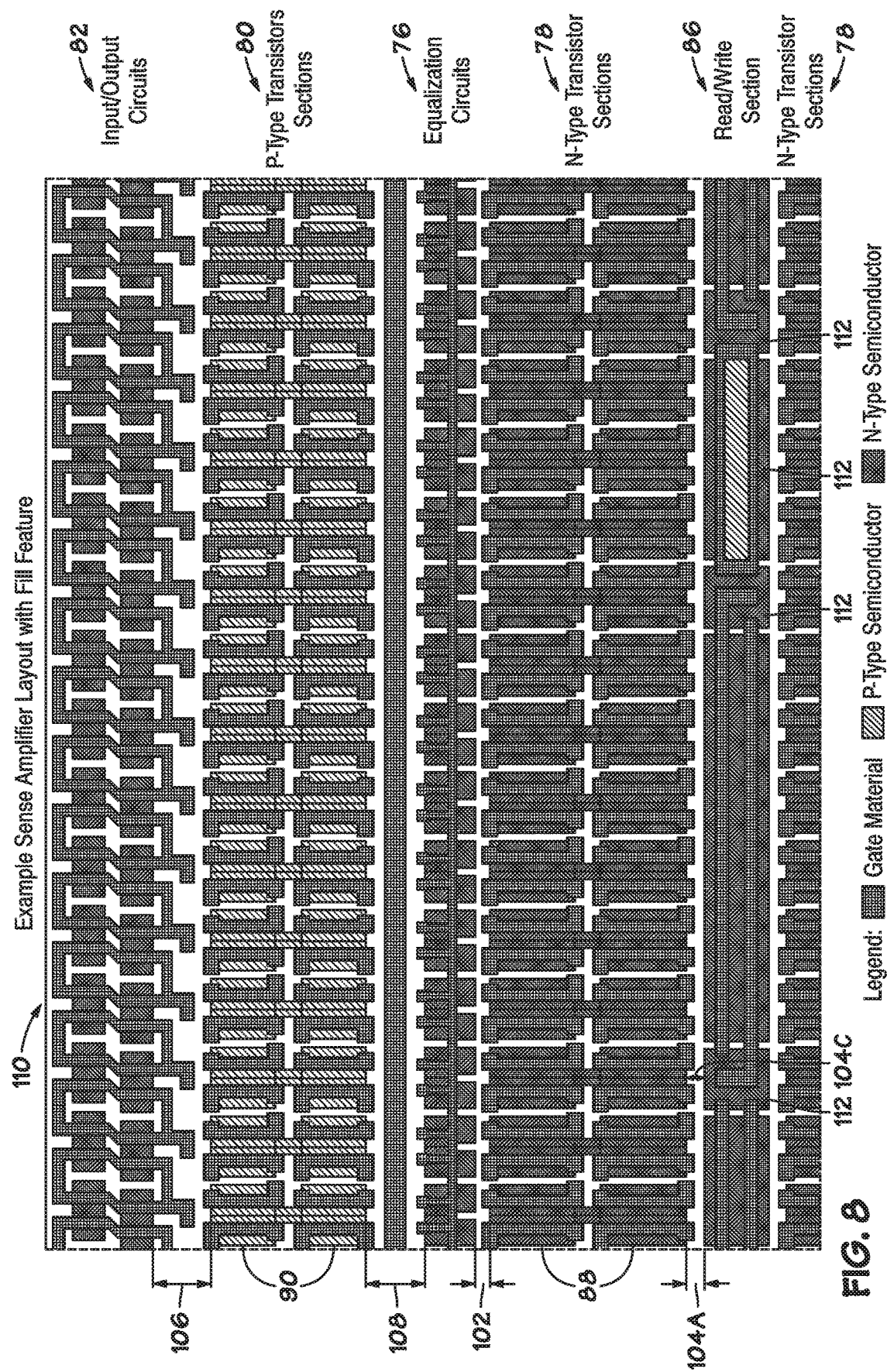
FIG. 8 is a schematic diagram illustrating the layout of a portion of the memory device of FIG. 5 with active matching fill features added, in accordance with an embodiment of the present disclosure.

In some scenarios, it may not be practical to ensure approximately equal spacing between each pair 88, 90 simply by an arrangement or rearrangement of the current electrical components of a memory device 14. In some embodiments, an active matching fill feature 112 may be introduced to balance the gaps between the active materials, as depicted in the layout 110 of FIG. 8. For example, in the layout 110, the active matching fill feature 112 is an n-type active material inserted into the read/write section 86. With the addition of an active matching fill feature 112, the upper n-type gap 102 is approximately equal to each of the lower n-type gaps 104A, 104C. As such, the active materials for each transistor pair 88, 90 may have approximately the same upper and lower separation.

Figure 9:
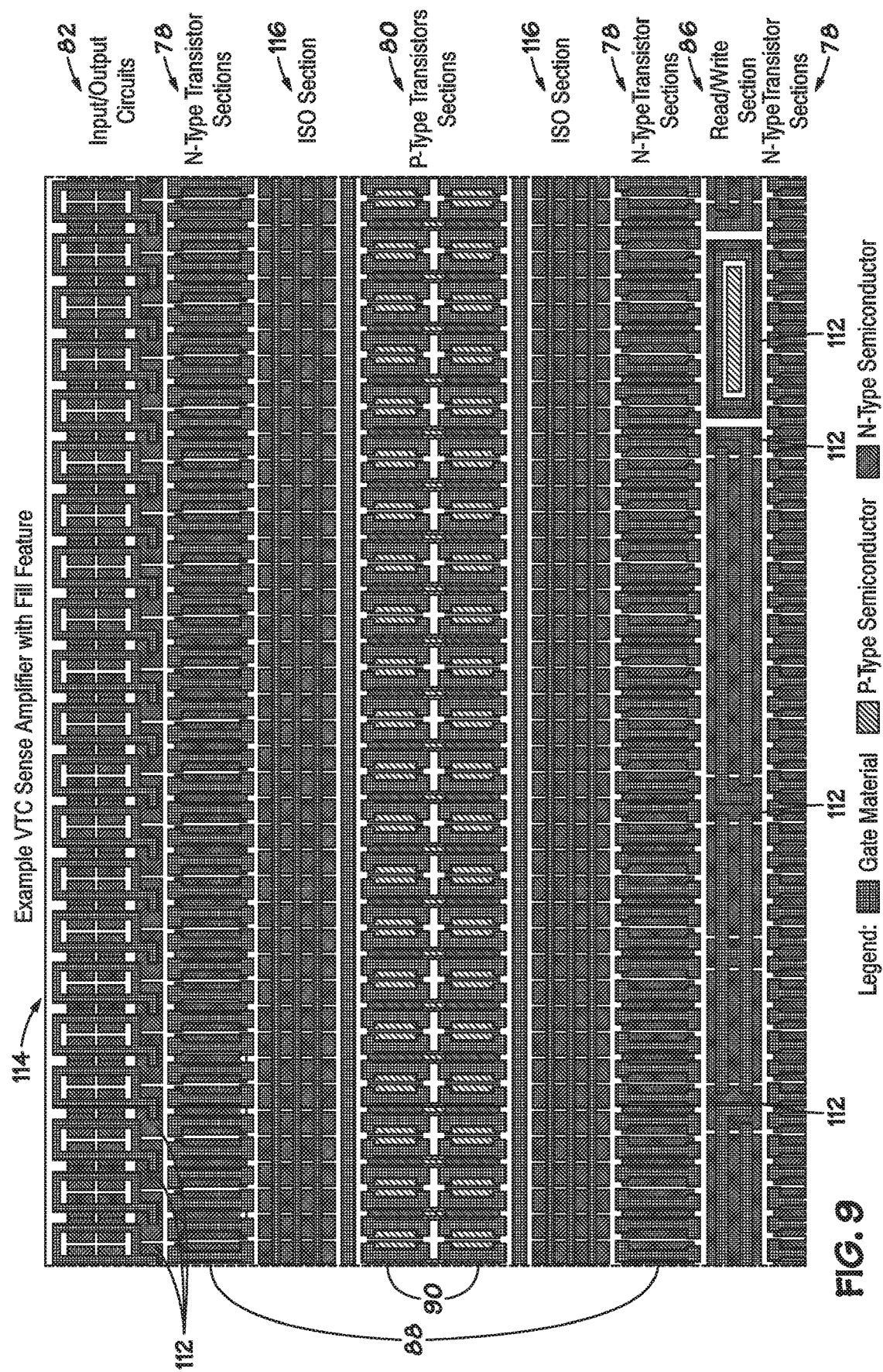
FIG. 9 is a schematic diagram illustrating the layout of a portion of an example memory device with active matching fill features added, in accordance with an embodiment of the present disclosure.

The active matching fill feature 112 may be any suitable active material (e.g., n-type or p-type), and may be used to achieve a balanced separation between the active materials of n-type pairs 88 or p-type pairs 90. Additionally, the active matching fill feature 112 may be used in multiple different types of memory devices 14, for those employing VT (e.g., layout 84, 110) or VTC, such as in layout 114 of FIG. 9. In some embodiments, an ISO section 116 may be included for use in determining a voltage transfer characteristic and operation of a VTC sense amplifier. An active matching fill feature 112 may be added to any suitable location (e.g., input/output circuits 82, read/write section 86, equalization circuits 76, ISO section 116, other suitable memory sections, or between sections) to balance the gaps (e.g., STI distance) surrounding active materials of transistors 72 desired to be matched. As will be appreciated, the active matching fill features 112 may also be introduced into a mirrored region (e.g., lower region 100) or between mirrored regions such as in the read/write section 86. By inserting an active matching fill feature 112, the systematic variation (e.g., differences in operation characteristics such as threshold voltage) between matched pairs 88, 90 may be reduced. For example, the variation between threshold voltages may be reduced to less than approximately 1 millivolt (mV), 5 mV, 10 mV, 25 mV, or 100 mV. The reduction in variations may be caused by a matching of mechanical stresses amongst transistors 72 in a pair 88, 90. As will be appreciated, an active matching fill feature 112 may assist in minimizing variations between any set of matched transistors 72 in the memory device 14 (e.g., in the p-type transistor sections 80, n-type transistor sections 78, ISO section 116, read/write section 86, equalization circuits 76, or any location where minimized variations in operational characteristics is desired).

In some embodiments, active matching fill features 112 may create unused (e.g., existing in an open circuit) transistors, capacitors, or other electrical components within the layout 84, 114. As such, the introduction of active matching fill features 112 into a layout of a memory device 14 may generate extra electrical components and/or areas of active material that would otherwise not be included on the layout of the memory device 14. Such components may be used for auxiliary processes, left floating, grounded, or set to a designated state. Furthermore, in some embodiments, other layers of material (e.g., non-conductive or semi-conductive material) may be used in conjunction with an active matching fill feature 112 to minimize possible effects of components left floating such as stray capacitance.

To help further illustrate, FIG. 10 is a flowchart 118 depicting a process of minimizing variations in the operational characteristics of transistors 72 by introducing an active matching fill feature 112. In some embodiments, it may be determined that a layout (e.g., layout 84) includes active material spacing around a matched pair 88, 90 of transistors 72 that is unbalanced (process block 120). To ascertain the appropriate placement and/or spacing of an active matching fill feature 112, the small active material gap (e.g., upper n-type gap 102) around a transistor 72 of a matched pair 88, 90 may be determined (process block 122) and the active matching fill feature 112 inserted in a respective larger gap (e.g., lower n-type gap 104B) to generate a replicate small gap (e.g., lower n-type gap 104C) (process block 124).

Furthermore, in some embodiments, the insertion of a matching fill feature 112 may be accomplished during the production of the memory device 14, as depicted in the flowchart 126 of FIG. 11. For example, the layering of active material(s) on a substrate, may, in turn, form one or more transistors 72 (process block 128). Before, after, and/or during the layering of materials to form the transistor 72, active material may be layered in an area proximate to one or more of the transistors 72 to form one or more active matching fill features 112 (process block 130). The active matching fill feature(s) 102 may be proximate the transistor(s) 72 such that the active material spacing around transistor pairs 88, 90 are matched (process block 132). As such, a matched pair 88, 90 may have reduced variation in operating parameters between the respective transistors 72. As should be appreciated, although the above flowcharts 118, 126 are depicted in a particular order, in certain embodiments, steps may be reordered, altered, deleted, repeated, and/or occur simultaneously.

While the current techniques may be susceptible to various modifications and alternative forms, specific embodiments have been shown by way of example in the drawings and have been described in detail herein. However, it should be understood that the current techniques are not intended to be limited to the particular forms disclosed. Rather, instead the present embodiments are intended to cover all modifications, equivalents, and alternatives falling within the spirit and scope of the present techniques as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
   a memory array comprising a plurality of memory cells;
   one or more sense amplifiers coupled to the memory array and each comprising a matched pair of transistors; and
   an active matching fill feature proximate to at least one transistor of the matched pair of transistors, wherein the active matching fill feature is configured to equilibrate a first distance between a first active material of a first transistor of the matched pair of transistors and a second active material of the memory device and a second distance between a third active material of a second transistor of the matched pair of transistors and a fourth active material of the memory device.

2. The memory device of claim 1, wherein a shallow trench isolation (STI) region is disposed in the first distance.

3. The memory device of claim 1, wherein the active matching fill feature is disposed in a read/write section of the memory device.

4. The memory device of claim 1, wherein the one or more sense amplifiers comprises a voltage transfer characteristic (VTC) sense amplifier.

5. The memory device of claim 1, wherein the memory device comprises a double data rate type five synchronous dynamic random access memory (DDR5 SDRAM).

6. The memory device of claim 1, wherein the active matching fill feature is an n-type active material.

7. The memory device of claim 1, wherein a sense amplifier of the one or more sense amplifiers is configured to output a logical state value based at least in part on a voltage of a memory cell of the plurality of memory cells and a threshold voltage.

8. The memory device of claim 7, wherein the active matching fill feature is configured to reduce a variation in the threshold voltage of a first transistor of the matched pair of transistors and the threshold voltage of a second transistor of the matched pair of transistors.

9. The memory device of claim 1, wherein the at least one transistor comprises the first transistor, and wherein the active matching fill feature comprises the second active material.

10. The memory device of claim 1, wherein the active matching fill feature comprises an electrically isolated component.

11. The memory device of claim 10, wherein the electrically isolated component comprises a third transistor or a capacitor.

12. A memory device comprising:
    a first transistor comprising a first active area comprising first active material; and
    a second transistor electrically coupled to the first transistor, the second transistor comprising a second active area comprising second active material; and
    an active matching fill feature configured to minimize a difference between a first gap, between the first active area and a third active area of the memory device, and a second gap, between the second and a fourth active area of the memory device.

13. The memory device of claim 12, wherein the first transistor and the second transistor, together, form a matched pair of transistors of a sense amplifier of the memory device.

14. The memory device of claim 12, wherein the active matching fill feature comprises third active material.

15. The memory device of claim 14, wherein the first active material, the second active material, and the third active material comprise p-type active material.

16. The memory device of claim 12, wherein the active matching fill feature is not electrically coupled to the first transistor.

17. A method comprising:
- determining a first spacing around a first transistor of a memory device, wherein the first spacing comprises a first gap between a first active area of the first transistor and a second active area of the memory device;
- determining a second spacing around a second transistor of the memory device, wherein the second spacing comprises a second gap between a third active area of the second transistor and a fourth area of the memory device; and
- inserting, into the memory device, active material to generate a fifth active area such that a first difference, between the first gap and a third gap between the third active area and the fifth active area, is less than a second difference, between the first gap and the second gap.

18. The method of claim 17, wherein the first difference, between the first gap and the third gap, is less than 50 nanometers.

19. The method of claim 17, wherein the memory device comprises a sense amplifier, and wherein the sense amplifier comprises the first transistor and the second transistor.

20. The method of claim 17, comprising inserting semiconductive material around the active material of the fifth active area.

* * * * *